(12) United States Patent
Chuang

(10) Patent No.: US 7,813,113 B2
(45) Date of Patent: Oct. 12, 2010

(54) EXPANSION INTERFACE MODULE HAVING PROTECTION CIRCUIT

(76) Inventor: Yi-Fang Chuang, 5F., No. 15, Lane 117, Sec. 4, Sanhe Rd., Sanchong City, Taipei County 241 (TW)

( * ) Notice: Subject to any disclaimer, the term of this patent is extended or adjusted under 35 U.S.C. 154(b) by 169 days.

(21) Appl. No.: 12/191,550

(22) Filed: Aug. 14, 2008

(65) Prior Publication Data
US 2010/0042770 A1 Feb. 18, 2010

(30) Foreign Application Priority Data
Nov. 30, 2007 (TW) ............... 96220433 U

(51) Int. Cl.
*H05K 5/00* (2006.01)
*H05K 7/00* (2006.01)
(52) U.S. Cl. ............... 361/679.01; 361/679.45; 361/752
(58) Field of Classification Search ......... 361/679.01, 361/679.32, 679.45, 679.6, 752
See application file for complete search history.

(56) References Cited
U.S. PATENT DOCUMENTS
2004/0107328 A1* 6/2004 Schultz et al. .............. 711/170
2008/0045084 A1* 2/2008 Chang ...................... 439/607

* cited by examiner

*Primary Examiner*—Jayprakash N Gandhi
*Assistant Examiner*—Anthony M Haughton
(74) *Attorney, Agent, or Firm*—Chun-Ming Shih; HDLS IPR Services

(57) ABSTRACT

An expansion interface module having protection circuit disposed on a front-side case panel and electrically connected to a main board. The expansion interface module includes a circuit board, a plurality of connectors, a protective element, and a connecting port. The connectors, protective element and the connecting port are electrically connected to the circuit board. The protective element is a semiconductor element. The protective element and the circuit board form a protection integrated circuit. One side of the main board is connected to a bus line. The bus line is inserted in the connecting port to provide electrical connection between the circuit board and the main board. Through this configuration, when an external device experiences abnormal operations, the protective element of the expansion interface module shields the resulting over current and signal spikes from entering and damaging the main board.

9 Claims, 3 Drawing Sheets

EXPANSION INTERFACE MODULE HAVING PROTECTION CIRCUIT

BACKGROUND OF THE INVENTION

1. Field of the Invention

The present invention generally relates to an expansion interface module, in particular, to an expansion interface module having protection circuit.

2. Description of Prior Art

The introduction of high speed data, audio and video transfer brings about the need for various interfaces to connect peripherals and other multimedia devices to a personal computer. Expansion interface modules are so developed for this need, integrating many interface standards such as USB, HDMI and DisplayPort for simpler transfer.

Conventional expansion interface modules achieve this simplicity by integrating various connectors that utilize aforementioned interface standards into a single circuit board, and electrically connecting the integrated circuit board to the main board of the personal computer. To operate, the connecting port of the expansion interface module is electrically connected to the main board of the personal computer, and the connector of the expansion interface module is connected to an external device through transfer cables.

SUMMARY OF THE INVENTION

In one aspect, the invention features an expansion interface module having protection circuit disposed on a front-side case panel and electrically connected to a main board. The expansion interface module includes a circuit board, a plurality of connectors, a protective element, and a connecting port. The connectors, the protective element and the connecting port are electrically connected to the circuit board.

Embodiments may include one or more of the following advantages. When an external device experiences abnormal operations, or is struck by lightning or improperly removed, the protective element of the expansion interface module shields the resulting over current and signal spikes from entering and damaging the main board. Additionally, the expansion interface module disposed on the front-side case panel, of a personal computer for example, allows additional external devices to be connected thereto when the back side connectors are in use.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

In cooperation with attached drawings, the technical contents and detailed description of the present invention are described thereinafter according to a preferable embodiment, being not used to limit its executing scope. Any equivalent variation and modification made according to appended claims is all covered by the claims claimed by the present invention.

Figure 1:
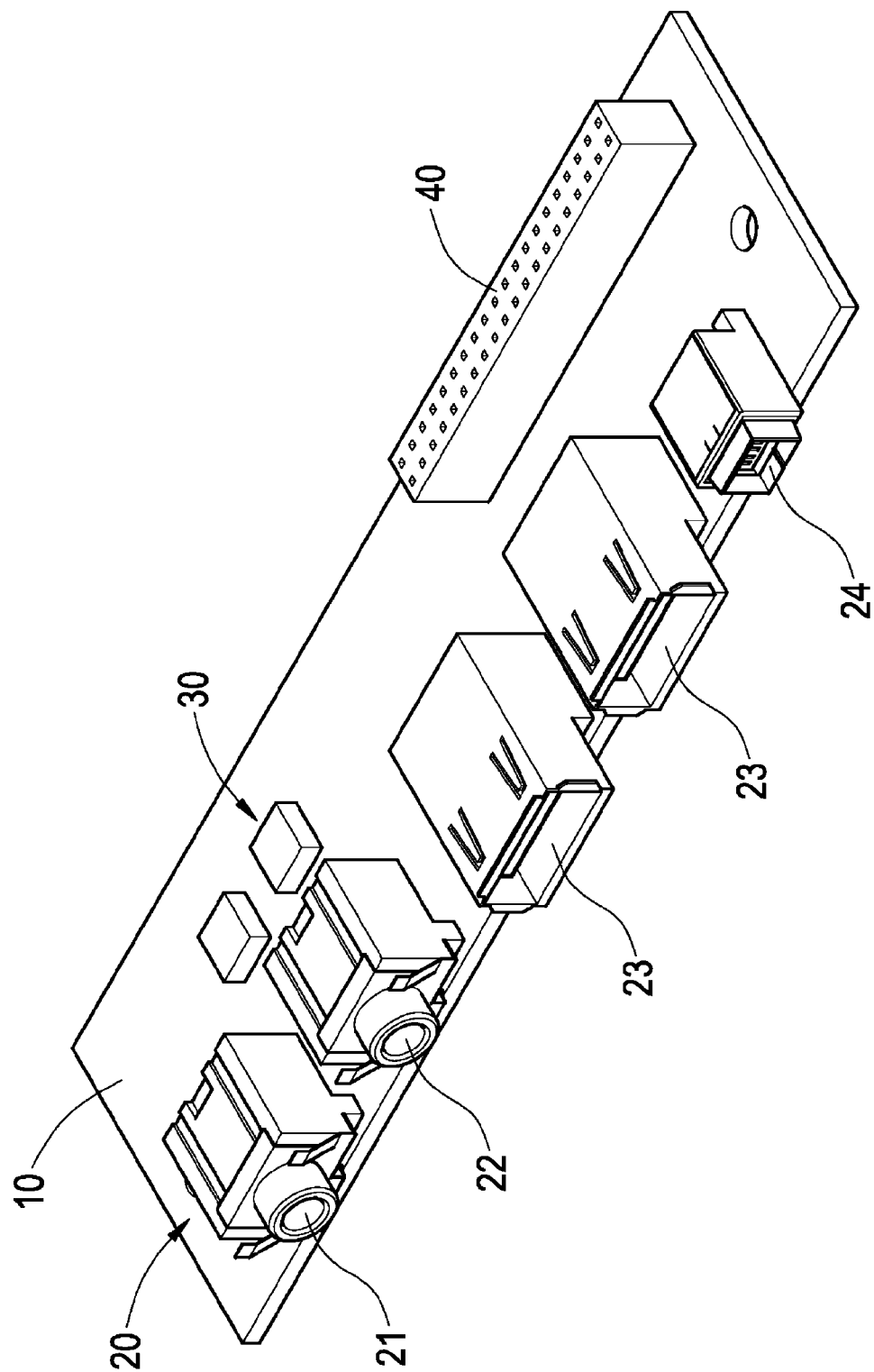
FIG. 1 is a perspective view of an expansion interface module having protection circuit.
Figure 2:
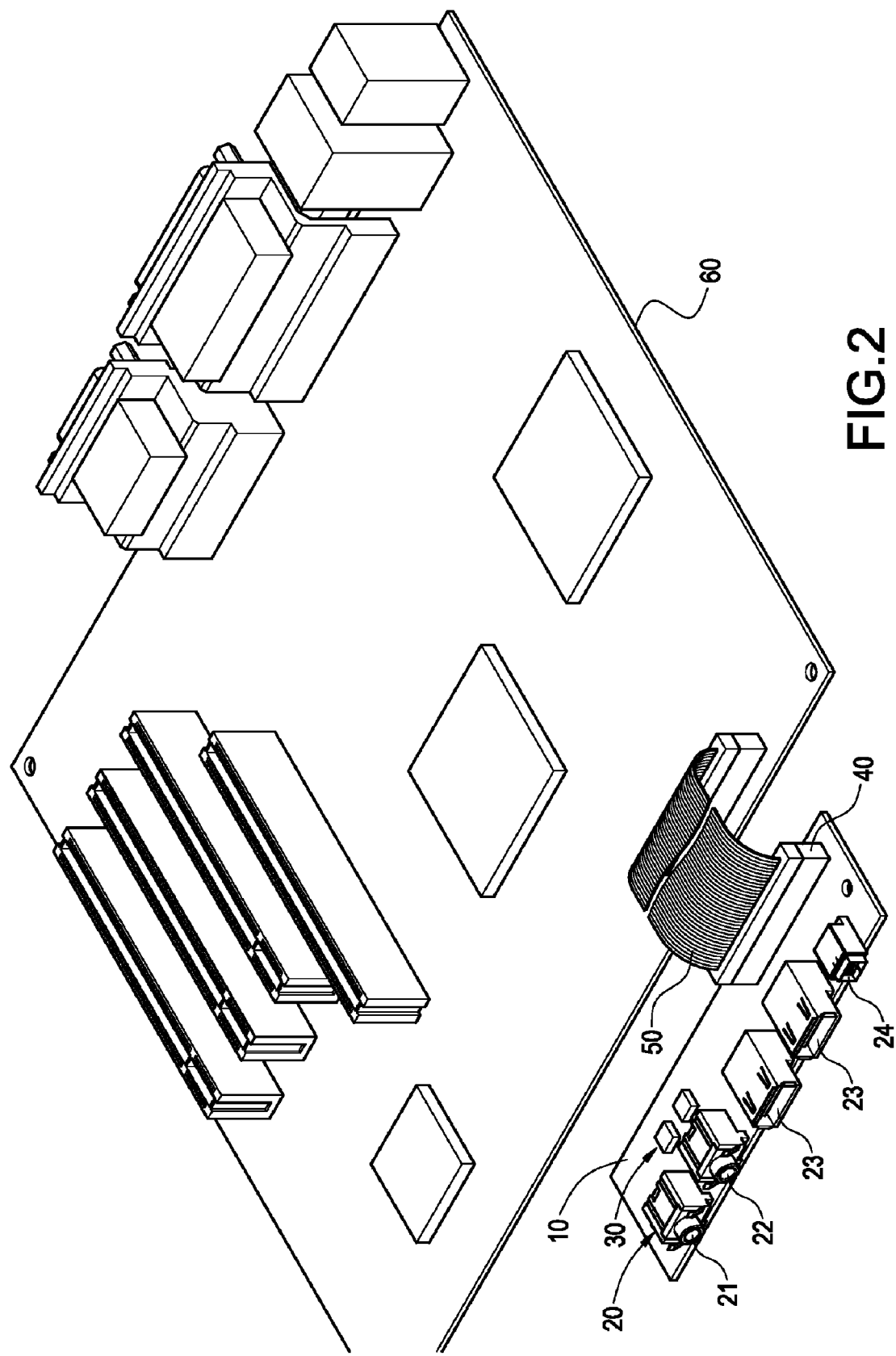
FIG. 2 is a perspective view of a first embodiment of an expansion interface module having protection circuit.

FIGS. 1 and 2 respectively show a perspective view of an expansion interface module having protection circuit and a perspective view of a first embodiment of an expansion interface module having protection circuit. The expansion interface module having protection circuit is disposed on a front-side case panel and electrically connected to a main board 60. The expansion interface module includes a circuit board 10, a plurality of connectors 20, a protective element 30, and a connecting port 40. Connectors 20 are located at one side on the top surface of the circuit board 10 and electrically connected to the circuit board 10. Connectors 20 can be a head phone jack 21, a microphone jack 22, a USB port 23, and/or a micro-USB port 24. Connectors 20 allow external devices such as printers, portable hard drives, optical disc drives, head phones, microphones, speakers, monitors to be connected to main board 60 of, for example, a personal computer.

Protective element 30 is located at one side on the top surface of circuit board 10 and electrically connected to the circuit board 10. Protective element 30 can be a semiconductor element. Protective element 30 has the following functions:

1. Protective element 30 provides ground-fault protection. When the circuit board 10 experiences ground fault, protective element 30 can shield outgoing current of the circuit board 10 from entering into main board 60, allowing the system to remain in operation unaffected by the short circuit.
2. Protective element 30 also regulates current output to prevent device damage. Protective element 30 considers power supply output capability and chooses current standard supported by the circuit board 10 for output, thereby preventing damage to the circuit board 10 from overload.
3. Protective element 30 also provides counter-current protection. When the circuit board 10 on the output end stops outputting current, the receiving end main board 60 still has residual current flowing through it. Protective element 30 operates to prevent the current in main board 60 from flowing back to the circuit board 10 and causing damage to the circuit board 10's internal circuit and electronic elements.
4. Protective element 30 further prevents damage to main board 60 from overheating.

When excessive main board 60's power consumption causes its temperature to exceed safe operating temperature, protective element 30 triggers its protective mechanism to stop current from continuing output to main board 60.

5. Protective element 30 also provides low voltage protection. Where exceedingly low voltage prevents main board 60 from operating normally, protective element 30 functions to maintain output voltage to ensure that main board 60 remain in operable conditions.

Together, protective element 30 and the circuit board 10 form a protection integrated circuit, shielding sudden surge of current or signal spikes from entering main board 60 and damaging the circuitry and electronic elements (not shown) therein.

Connecting port 40 is located at one side on the top surface of the circuit board 10 and electrically connected to the circuit board 10. The connecting port is a bus connecting port.

Main board 60 is electrically connected to the circuit board 10 through a bus line 60. One end of bus line 60 is electrically connected to main board 60, and another end of bus line 60 is inserted in and electrically connected to connecting port 40.

Figure 3:
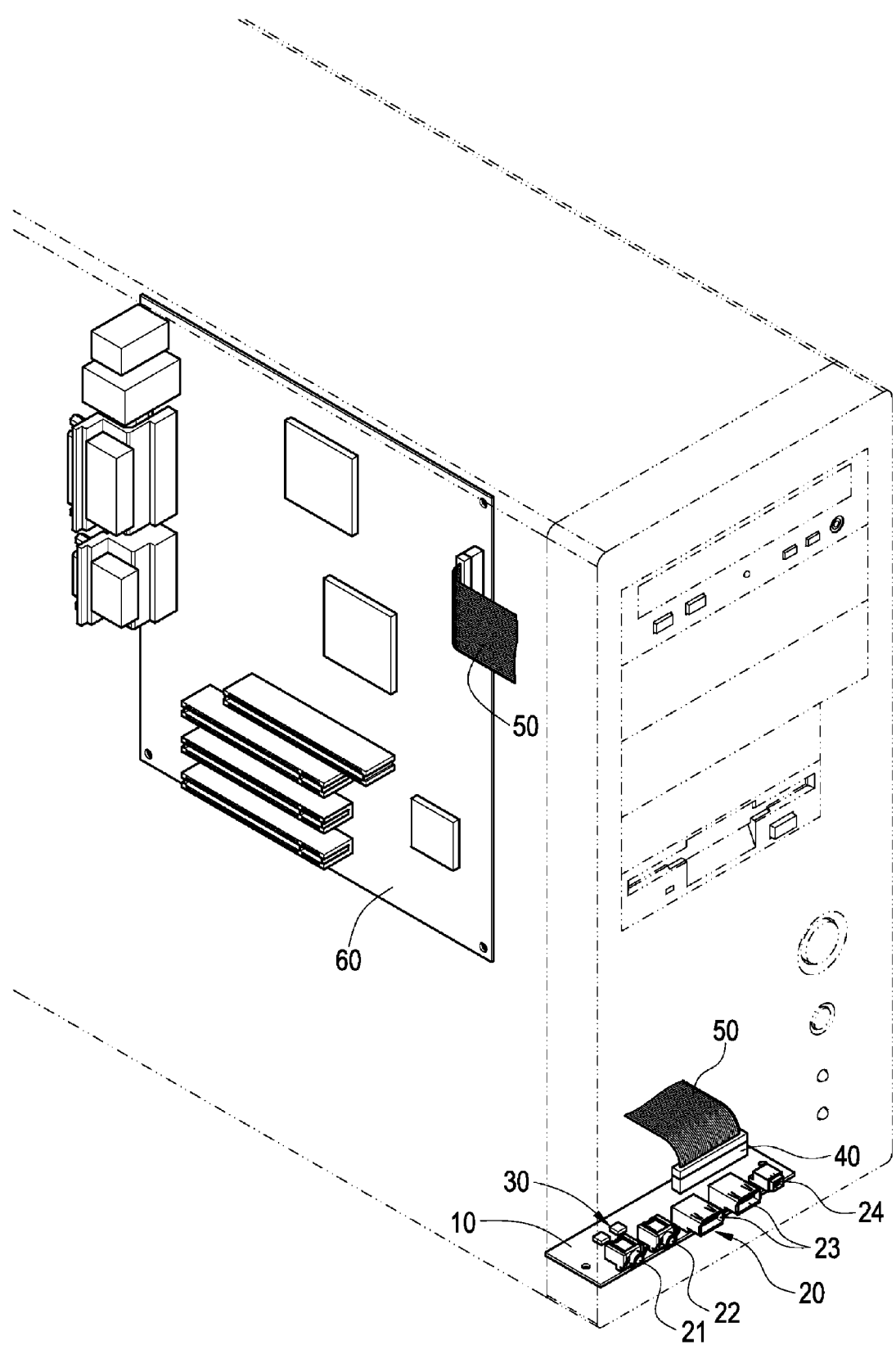
FIG. 3 is a perspective view of a second embodiment of an expansion interface module having protection circuit.

FIG. 3 shows a perspective view diagram of a second embodiment of an expansion interface module having protection circuit. To operate, the expansion interface module having protection circuit, the connector of the transfer cable (not shown) is connected to one of the corresponding connectors 20 and the external device. The data or audio/video on external device can therefore be transferred to the circuit board 10 through the corresponding connectors 20, and further transferred to main board 60 through connecting port 60.

To prevent excessive current or signal spikes from entering main board 60, such as when an external device experiences abnormal operations, struck by lightning, or improperly removed, protective element 30 on the circuit board 10 is configured to respond by being in open circuit, thereby preventing damage to the circuitry and electronic elements on main board 60.

In some embodiments, the invention allows additional external devices to be connected to an electronic device through the expansion interface module disposed on its frontside case panel when connectors at its back side panel are in use.

What is claimed is:

1. An expansion interface module having protection circuit, comprising:
   a circuit board disposed on a case panel of a computer and electrically connected to a main board of the computer;
   a plurality of connectors, disposed on the circuit board and electrically connected to the circuit board;
   a protective element, disposed on the circuit board and electrically connected to the circuit board, to provide ground-fault protection, counter-current protection or low voltage protection, to regulate current output to prevent device damage, or to prevent damage to the main board from overheating;
   a connecting port, disposed on the circuit board and electrically connected to the circuit board, and
   a bus line with one end electrically connected to the main board and the other end inserted in and electrically connected to the connecting port.

2. The expansion interface module having protection circuit according to claim 1, wherein the connector is a head phone jack.

3. The expansion interface module having protection circuit according to claim 1, wherein the connector is microphone jack.

4. The expansion interface module having protection circuit according to claim 1, wherein the connector is a universal serial bus (USB) port.

5. The expansion interface module having protection circuit according to claim 1, wherein the connector is a micro-USB port.

6. The expansion interface module having protection circuit according to claim 1, wherein the connecting port is a bus connecting port.

7. The expansion interface module having protection circuit according to claim 1, wherein the protective element and the circuit board form a protection integrated circuit.

8. The expansion interface module having protection circuit according to claim 1, wherein the protective element is a semiconductor element.

9. The expansion interface module having protection circuit according to claim 1, wherein the plurality of connectors and the connecting port are located at one side on the top surface of the circuit board and electrically connected to the circuit board.

* * * * *